(12) United States Patent
Matsui et al.

(10) Patent No.: US 10,811,488 B2
(45) Date of Patent: Oct. 20, 2020

(54) DISPLAY DEVICE

(71) Applicant: Sharp Kabushiki Kaisha, Sakai, Osaka (JP)

(72) Inventors: Takashi Matsui, Sakai (JP); Yukio Shimizu, Sakai (JP); Gen Nagaoka, Sakai (JP); Motoji Shiota, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/466,808

(22) PCT Filed: Sep. 22, 2017

(86) PCT No.: PCT/JP2017/034286
§ 371 (c)(1),
(2) Date: Jun. 5, 2019

(87) PCT Pub. No.: WO2019/058501
PCT Pub. Date: Mar. 28, 2019

(65) Prior Publication Data
US 2019/0363153 A1    Nov. 28, 2019

(51) Int. Cl.
*H01L 27/32* (2006.01)
*H01L 51/00* (2006.01)

(52) U.S. Cl.
CPC ...... *H01L 27/3276* (2013.01); *H01L 27/3258* (2013.01); *H01L 51/0097* (2013.01)

(58) Field of Classification Search
CPC ............ H01L 27/3276; H01L 27/3258; H01L 51/0097
See application file for complete search history.

(56) References Cited

U.S. PATENT DOCUMENTS

| | | | |
|---|---|---|---|
| 2011/0248276 A1 | 10/2011 | Son et al. | |
| 2014/0138637 A1 | 5/2014 | Yang et al. | |
| 2014/0353670 A1 | 12/2014 | Youn et al. | |
| 2016/0174304 A1* | 6/2016 | Kim | H01L 51/0097 313/511 |
| 2016/0204185 A1* | 7/2016 | Iijima | H01L 27/3276 257/91 |
| 2016/0268542 A1 | 9/2016 | Suzuki | |

(Continued)

FOREIGN PATENT DOCUMENTS

| | | |
|---|---|---|
| CN | 103700322 A | 4/2014 |
| JP | 2011-222933 A | 11/2011 |

(Continued)

OTHER PUBLICATIONS

Official Communication issued in International Patent Application No. PCT/JP2017/034286, dated Dec. 5, 2017.

*Primary Examiner* — Christine A Enad
(74) *Attorney, Agent, or Firm* — Keating & Bennett, LLP

(57) ABSTRACT

A display device includes a TFT layer provided in a display area, a bending section and a terminal in a non-active area, and a terminal wiring line that connects to the terminal through the bending section, and the terminal wiring line includes a first wiring line and a second wiring line each positioned on both sides of the bending section and a third wiring line that passes through the bending section and is electrically connected with each of the first wiring line and the second wiring line and curved so as to have recesses and protrusions.

9 Claims, 10 Drawing Sheets

(56) References Cited

U.S. PATENT DOCUMENTS

| | | | | |
|---|---|---|---|---|
| 2017/0170206 A1* | 6/2017 | Lee | ............ | H01L 51/52 |
| 2018/0145125 A1* | 5/2018 | Lee | ............ | H01L 27/3262 |
| 2019/0019441 A1* | 1/2019 | Shin | ............ | G09G 3/3233 |
| 2020/0066822 A1* | 2/2020 | Saitoh | ............ | G09F 9/30 |

FOREIGN PATENT DOCUMENTS

| | | |
|---|---|---|
| JP | 2014-232300 A | 12/2014 |
| JP | 2016-503515 A | 2/2016 |
| JP | 2016-136515 A | 7/2016 |
| JP | 2016-170266 A | 9/2016 |
| JP | 2017-111435 A | 6/2017 |
| WO | 2014/126403 A1 | 8/2014 |

* cited by examiner

US 10,811,488 B2

DISPLAY DEVICE

TECHNICAL FIELD

The disclosure relates to a display device and a manufacturing method for the display device.

BACKGROUND ART

PTL 1 discloses configuration in which a peripheral area of a display device is bent.

CITATION LIST

Patent Literature

PTL 1: JP 2016-170266 A

SUMMARY

Technical Problem

When a bending section is formed in the peripheral edge of the display device, a terminal wiring line passing through the bending section might be broken. In addition, when the terminal wiring line passing through the bending section is bent in a planar direction or partially expanded in order to suppress a break in the terminal wiring line passing through the bending section, an area occupied by the terminal wiring line is increased. As a result, the frame narrowing of the display device is hindered.

Solution to Problem

A display device according to one aspect of the disclosure includes a resin layer, a TFT layer configured to be provided on an upper layer of the resin layer, a plurality of light-emitting element layers configured to form a display area and configured to be provided on an upper layer of the TFT layer, a frame area configured to be provided in a periphery of the display area, a terminal section configured to be provided on an end section of the frame area, a bending section configured to be provided between the display area and the terminal section, and a terminal wiring line configured to be provided on the bending section and electrically connect to the terminal section, wherein the terminal wiring line includes a first wiring line and a second wiring line positioned on both sides of the bending section, and at least one third wiring line passing through the bending section and being electrically connected with each of the first wiring line and the second wiring line, and the third wiring line is curved so as to have recesses and protrusions in the bending section in a perpendicular direction of the display device.

A manufacturing method for a display device according to one aspect of the disclosure, the display device being configured to include a resin layer, a TFT layer configured to be provided on an upper layer of the resin layer, a plurality of light-emitting element layers configured to form a display area and configured to be provided on an upper layer of the TFT layer, a frame area configured to be provided in a periphery of the display area, a terminal section configured to be provided on an end section of the frame area, a bending section configured to be provided between the display area and the terminal section, and a terminal wiring line configured to be provided on the bending section and electrically connect to the terminal section, includes forming a first wiring line and a second wiring line that are positioned on both sides of the bending section, and forming a third wiring line that is electrically connected with each of the first wiring line and the second wiring line and curved in a recessed and protruding manner in the bending section in a perpendicular direction of the display device.

Advantageous Effects of Disclosure

According to one aspect of the disclosure, there are effects in that a possibility that the terminal wiring line passing through the bending section might be broken is reduced, and the frame narrowing of the display device can be achieved.

DESCRIPTION OF EMBODIMENTS

Figure 1:
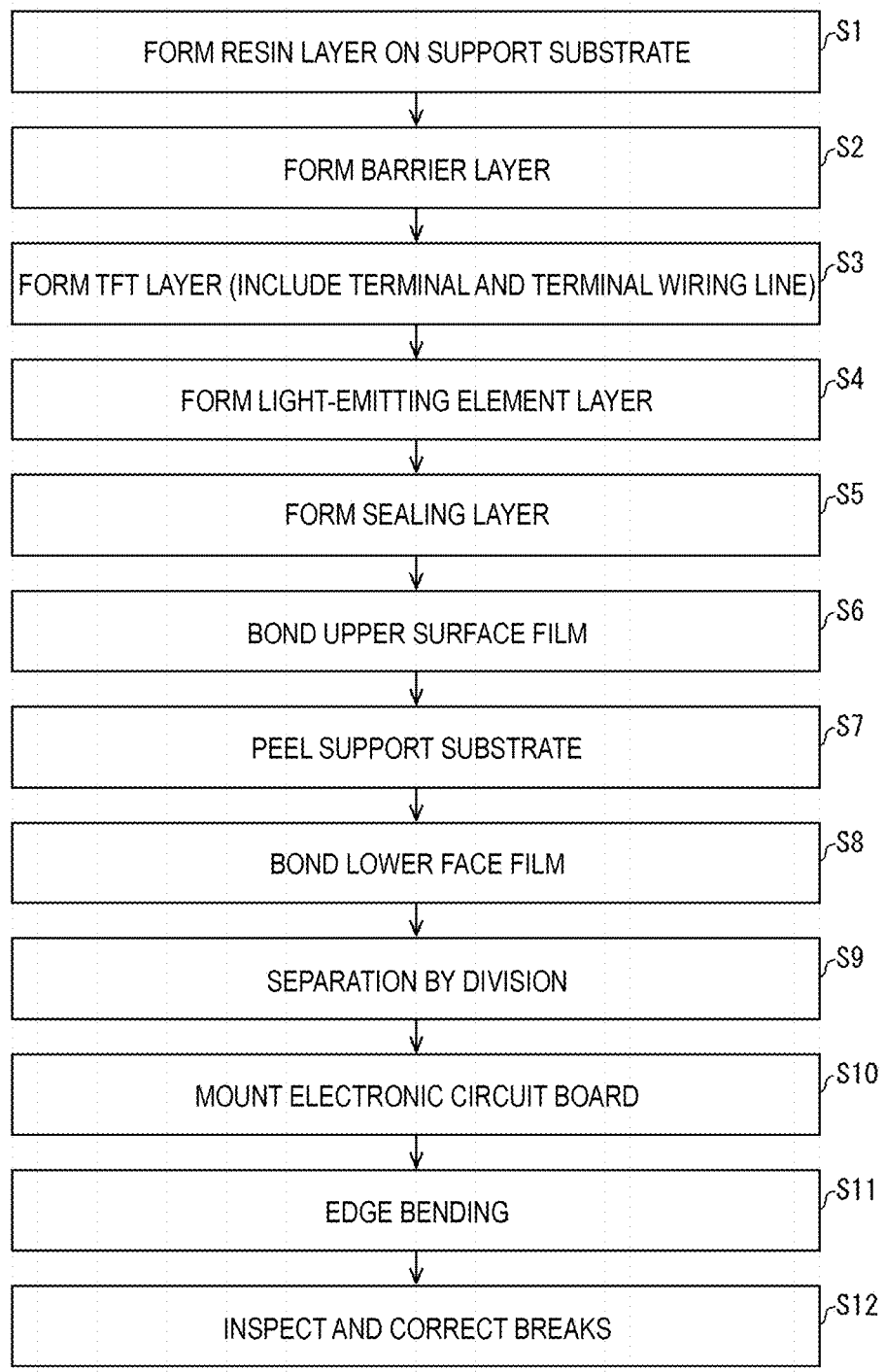
FIG. 1 is a flowchart illustrating an example of a manufacturing method of a display device.
Figure 2:
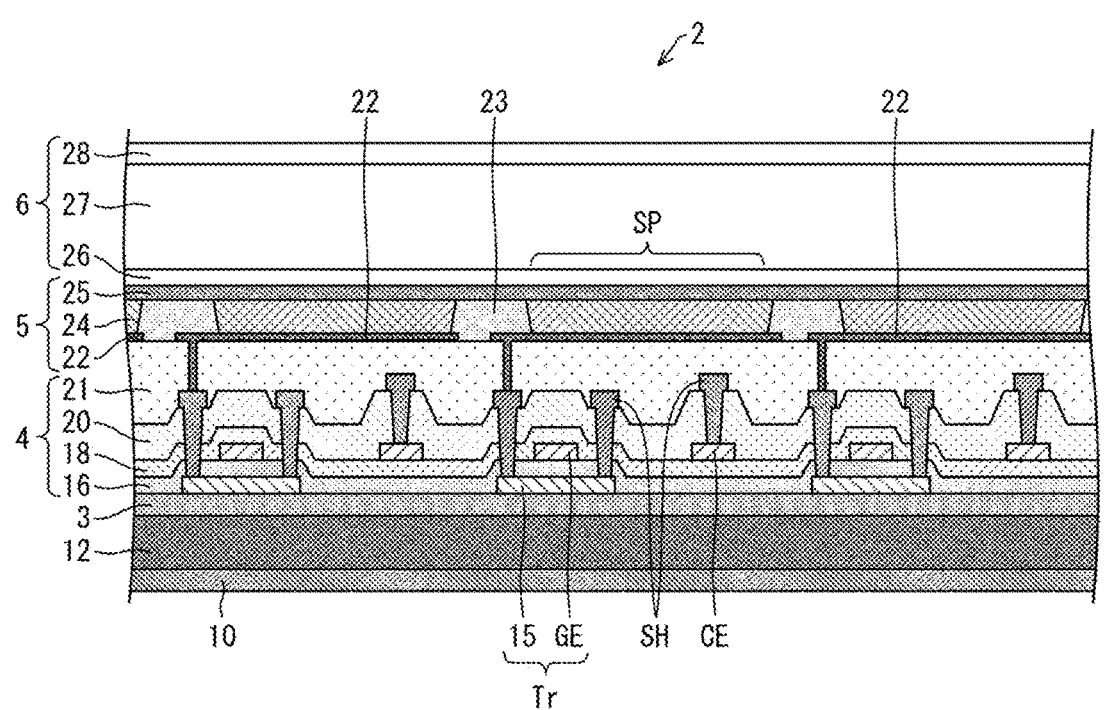
FIG. 2 is a cross-sectional view illustrating a configuration example of a display section of the display device.
Figure 3:
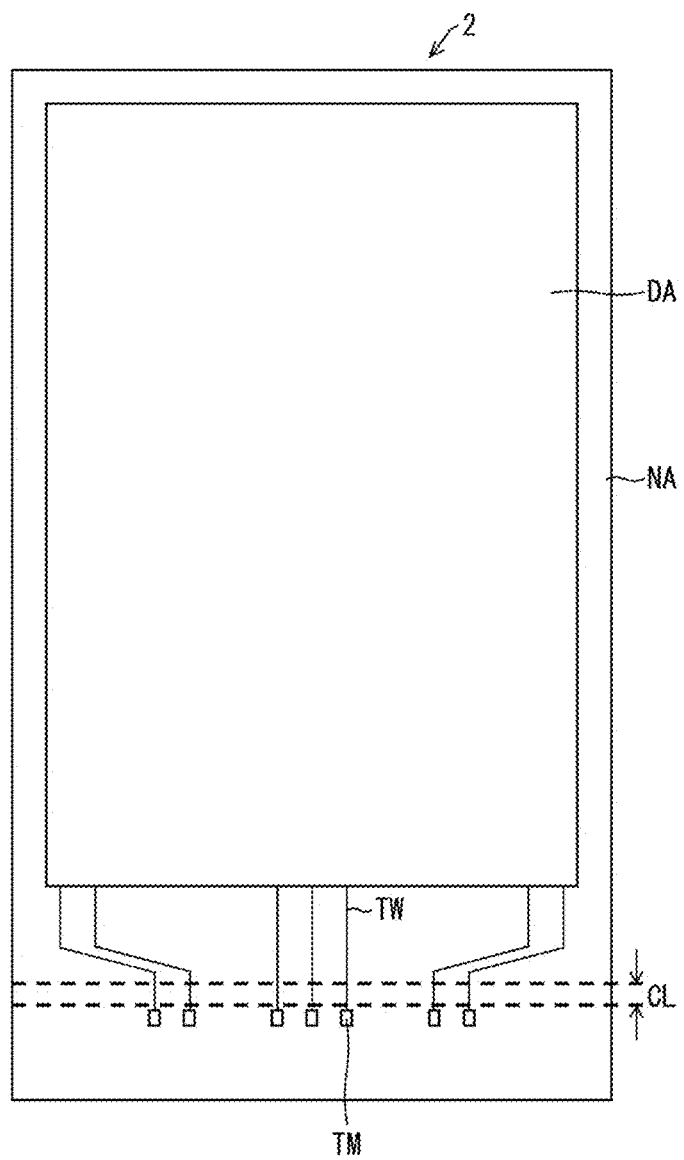
FIG. 3 is a plan view illustrating a configuration example of the display device.

FIG. 1 is a flowchart illustrating an example of a manufacturing method of a display device. FIG. 2 is a cross-sectional view illustrating a configuration example of a display section of the display device. FIG. 3 is a plan view illustrating a configuration example of the display device. Hereinafter, "same layer" means being formed of an identical material in an identical process, and "lower layer" means being formed in a prior process with respect to that of a layer to be compared, and "upper layer" means being formed in a posterior process with respect to that of a layer to be compared.

When a flexible display device is manufactured, as illustrated in FIGS. 1 to 3, first, a resin layer 12 is formed on a transparent support substrate (for example, a mother glass substrate) (Step S1). Next, a barrier layer 3 is formed (Step S2). Next, a TFT layer 4 including a terminal (terminal section) TM and a terminal wiring line TW is formed (Step S3). Next, a light-emitting element layer (for example, an OLED element layer) 5 of a top-emitting type is formed (Step S4). Next, a sealing layer 6 is formed (Step S5). Next, an upper face film is bonded to the sealing layer 6 (Step S6).

Next, the lower face of the resin layer 12 is irradiated with laser light through the support substrate, thereby reducing bonding strength between the support substrate and the resin layer 12 and peeling the support substrate off the resin layer 12 (Step S7). Next, a lower face film 10 is bonded to the lower face of the base layer 12 (Step S8). Next, a layered body including the lower face film 10, the resin layer 12, the barrier layer 3, the TFT layer 4, the light-emitting element layer 5, and the sealing layer 6 is divided into a plurality of individual pieces (Step S9). Next, an electronic circuit board (for example, IC chip) is mounted on the terminal TM of an edge section (Step S10). Next, an edge bending (process for bending a bending section CL in FIG. 3 by 180 degrees) is applied, thereby forming a display device 2 (Step S11). Next, inspection for breaks is performed, and if a break is present, correction is made (Step S12). Note that each of the above-described steps is performed by a display device manufacturing apparatus described later.

Examples of the material of the resin layer 12 include polyimide, epoxy, and polyamide. Examples of the material of the lower face film 10 include polyethylene terephthalate (PET).

The barrier layer 3 is a layer that inhibits moisture or impurities from reaching the TFT layer 4 or the light-emitting element layer 5 when the display device is being used, and can be constituted by a silicon oxide film, a silicon nitride film, or a silicon oxynitride film, or by a layered film of these, formed using CVD, for example.

The TFT layer 4 is provided on the upper layer of the resin layer 12. The TFT layer 4 includes a semiconductor film 15, an inorganic insulating film 16 (a gate insulating film) that is formed above the semiconductor film 15, a gate electrode GE that is formed above the inorganic insulating film 16, an inorganic insulating film 18 that is formed above the gate electrode GE, capacitance wiring line CE that is formed above the inorganic insulating film 18, an inorganic insulating film 20 that is formed above the capacitance wiring line CE, source wiring lines SH and terminals TM that are formed above the inorganic insulating film 20, and a flattening film 21 that is formed above the source wiring lines SH and the terminals TM.

A thin film transistor (TFT) Tr is configured to include the semiconductor film 15, the inorganic insulating film 16 (the gate insulating film), and the gate electrode GE.

In a non-active area NA of the TFT layer 4, the terminals TM that are used for connection with an electronic circuit board, such as an IC chip and an FPC, and the terminal wiring lines TW (described later in detail) that connect the terminals TM with wiring lines in a display area DA, and the like are formed. The terminals TM are provided on the end section of the non-active area NA.

The semiconductor film 15 is formed of, for example, low-temperature polysilicon (LTPS) or an oxide semiconductor. Note that FIG. 2 illustrates the TFT that has a top gate structure in which the semiconductor film 15 is the channel, but the TFT may have a bottom gate structure (when the TFT channel is the oxide semiconductor, for example).

The gate electrode GE, a capacitance electrode CE, the source wiring line SH, the terminal wiring line TW, and the terminals TM are each constituted by a single-layer metal film or a layered metal film including at least one of aluminum (Al), tungsten (W), molybdenum (Mo), tantalum (Ta), chromium (Cr), titanium (Ti), and copper (Cu), for example.

The inorganic insulating films 16, 18, and 20 can be constituted by a silicon oxide (SiOx) film or a silicon nitride (SiNx) film, or a layered film of these, formed using CVD, for example.

The flattening film (interlayer insulating film) 21 can be constituted, for example, by a coatable photosensitive organic material, such as a polyimide or an acrylic.

The light-emitting element layer (for example, an organic light-emitting diode layer) 5 includes an anode 22 that is formed above the flattening film 21, a bank 23 that covers the edge of the anode 22, an electroluminescence (EL) layer 24 that is formed above the anode 22, a cathode 25 that is formed above the EL layer 24, and for each subpixel, a light-emitting element (for example, OLED: an organic light-emitting diode) that includes the insular anode 22, the EL layer 24, and the cathode 25, and a sub-pixel circuit for driving this are provided. The bank 23 (anode edge cover) 23 can be formed of a coatable photosensitive organic material such as polyimide or acrylic, for example. The light-emitting element layer 5 including the light-emitting element, the sub-pixel circuit and the like forms the display area DA and is provided on the upper layer of the TFT layer 4.

For example, the organic EL layer 24 is formed by layering a hole injection layer, a hole transport layer, a light-emitting layer, an electron transport layer, and an electron injection layer in the order from the lower layer side. The light-emitting layer is formed for each subpixel in an insular shape by a vapor deposition method or an ink-jet method, but other layers can be provided as a flat common layer. In addition, it is possible to have configuration in which one or more layers out of the hole injection layer, the hole transport layer, the electron transport layer, and the electron injection layer are not formed.

The anode (anode) 22 is formed by layering indium tin oxide (ITO) and an alloy containing Ag, for example, and has light reflectivity (to be described below in more detail). The cathode 25 can be constituted by a light-transmissive conductive material such as indium tin oxide (ITO) and indium zinc oxide (IZO).

In the case that the light-emitting element layer 5 is the OLED layer, positive holes and electrons are recombined inside the EL layer 24 by a drive current between the anode 22 and the cathode 25, and light is emitted as a result of excitons that are generated by the recombination falling into a ground state. Since the cathode 25 is light-transmissive and the anode 22 is light-reflective, the light emitted from the EL layer 24 travels upward and results in top emission.

The light-emitting element layer 5 is not limited to OLED element configurations, and may be an inorganic light-emitting diode or a quantum dot light-emitting diode.

The sealing layer 6 is light-transmissive, and includes a first inorganic sealing film 26 that covers the cathode 25, an organic sealing film 27 that is formed above the first inorganic sealing film 26, and a second inorganic sealing film 28 that covers the organic sealing film 27. The sealing layer 6 covering the light-emitting element layer 5 prevents foreign matters, such as water and oxygen, from infiltrating into the light-emitting element layer 5.

The first inorganic sealing film 26 and the second inorganic sealing film 28 can be each constituted by a silicon oxide film, a silicon nitride film, or a silicon oxynitride film, or by a layered film of these, formed using CVD. The organic sealing film 27 is thicker than the first inorganic sealing film 26 and the second inorganic sealing film 28, is a light-transmissive organic film, and can be constituted by a coatable photosensitive organic material such as a polyimide or an acrylic.

After the support substrate has been peeled off, the lower face film 10 is bonded to the lower face of the resin layer 12, thereby achieving a display device having excellent flexibility, and examples of a material of the lower face film 10 include PET and the like.

Thereinbefore, the explanation has been given for a case of manufacturing the flexible display device, but when a non-flexible display device is manufactured, replacement of the substrate and the like is not required, and thus the processing may proceed from Step S5 to Step S9 illustrated in FIG. 1, for example.

First Embodiment

Figure 4:
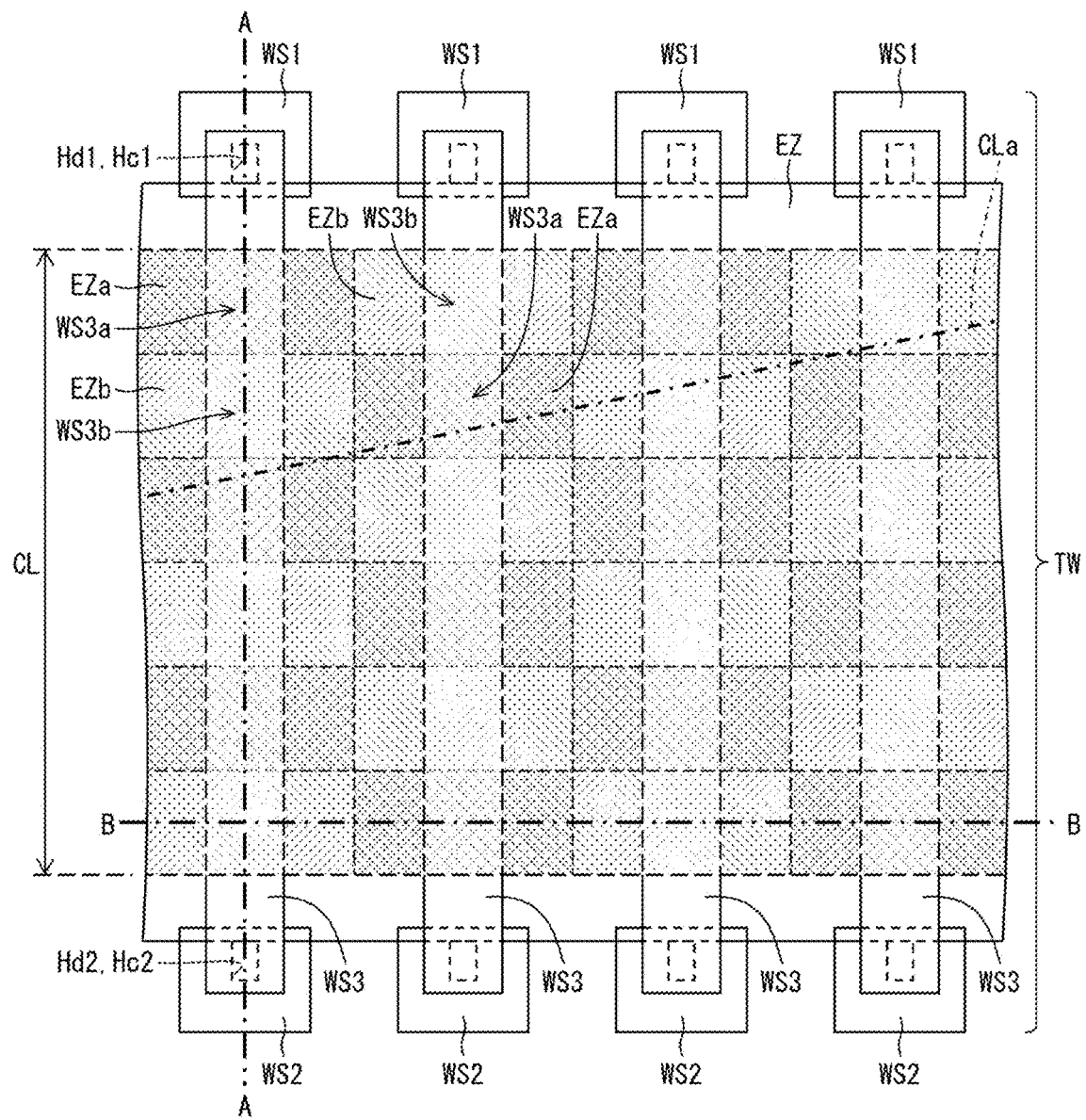
FIG. 4 is a plan view illustrating a peripheral edge of the display device of a first embodiment.
Figure 5:
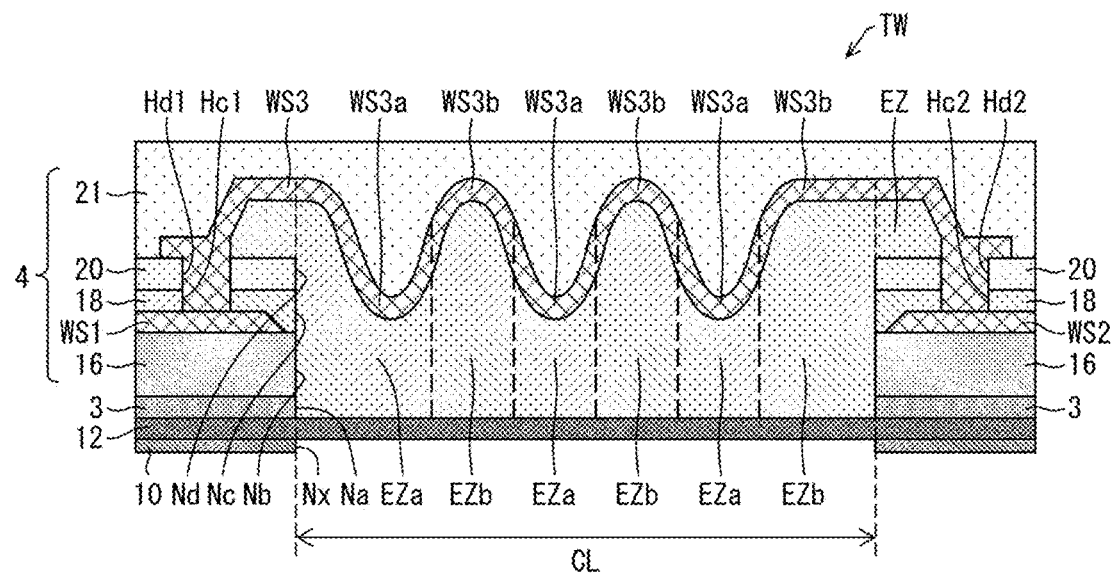
FIG. 5 is a cross-sectional view taken along line A-A illustrated in FIG. 4.
Figure 6:
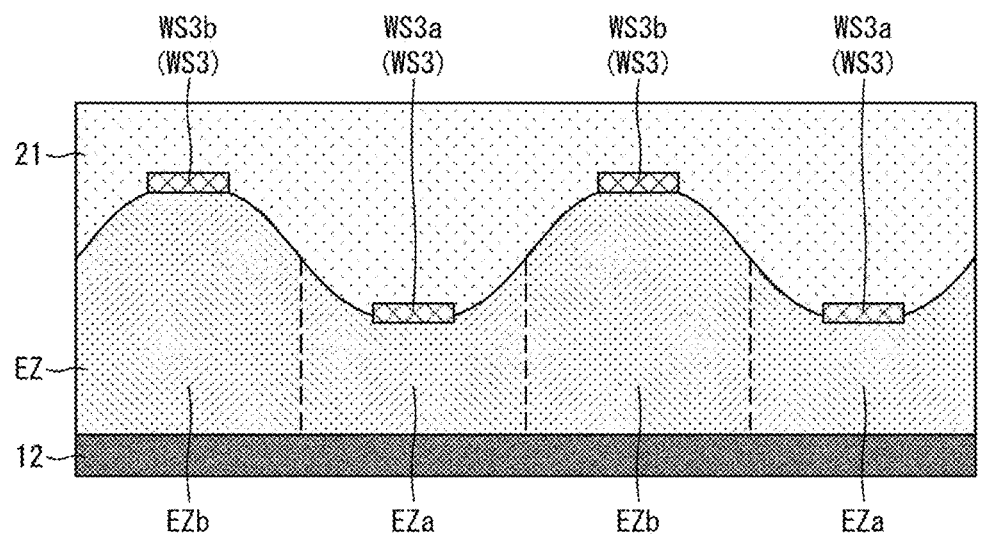
FIG. 6 is a cross-sectional view taken along line B-B illustrated in FIG. 4.
Figure 7:
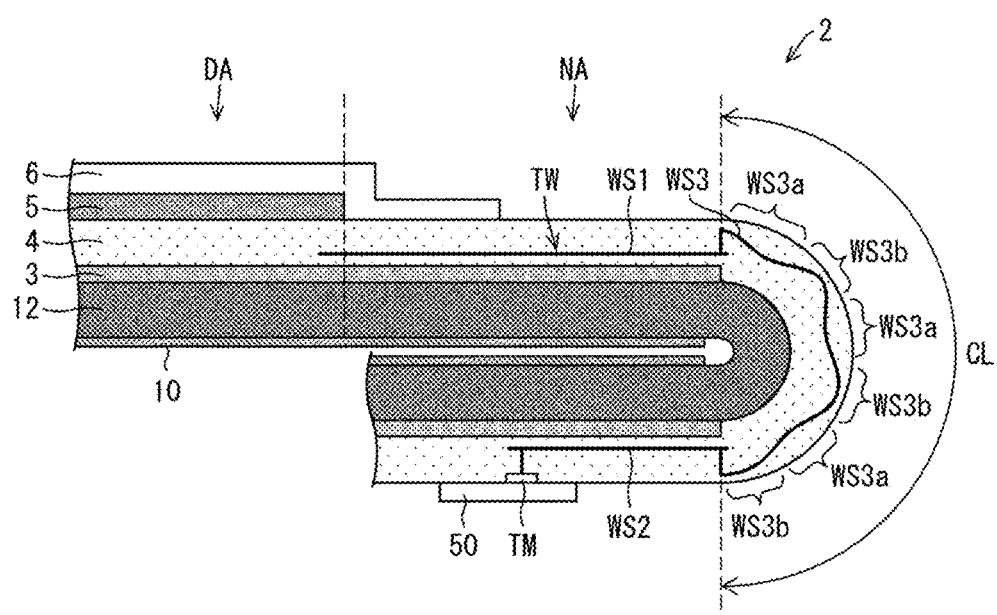
FIG. 7 is a cross-sectional view illustrating an example of the bending of a non-active area of the display device of the first embodiment.

FIG. 4 is a plan view illustrating a peripheral edge of the display device of a first embodiment. FIG. 5 is a cross-sectional view taken along line A-A illustrated in FIG. 4. FIG. 6 is a cross-sectional view taken along line B-B illustrated in FIG. 4. FIG. 7 is a cross-sectional view illustrating an example of the bending of a non-active area of the display device of the first embodiment.

As illustrated in FIGS. 4 to 7, the non-active area (a non-display area and a frame area) NA of the display device 2 includes the lower face film 10, the resin layer 12, the barrier layer 3, the inorganic insulating film (first inorganic insulating film) 16, the inorganic insulating film (second inorganic insulating film) 18, the inorganic insulating film (third inorganic insulating film) 20, a reinforcing film EZ (flexible insulating film), the flattering film 21 (flexible insulating film) that serves as an underlayer of the light-emitting element layer 5, the terminal wiring lines TW, and the terminals TM, and the bending section CL is provided on the non-active area NA. The non-active area NA is provided in the periphery of the display area.

The bending section CL is provided between the display area DA and the terminals TM. For example, the width (the length in a direction in parallel to the extending direction of a third wiring line WS3) of the bending section CL is equal to or greater than 1 mm, that is, approximately 2 mm. For example, the width of the bending section CL can be changed depending on the size or use of the display device 2.

As illustrated in FIG. 7, the terminal TM (see FIG. 7) is connected to the display area DA by the terminal wiring line TW passing through the bending section CL. The display device 2 is bent by 180 degrees at the bending section CL, thereby connecting the terminal TM disposed on the lower face side and an electronic circuit board 50 (IC chip or flexible printed circuit board).

As illustrated in FIG. 5, the reinforcing film EZ can be constituted, for example, by a coatable photosensitive organic material, such as a polyimide or an acrylic and formed on an upper layer with respect to the inorganic insulating film 20 and on a lower layer with respect to the flattening film 21.

The lower face film 10, the barrier layer 3, and the inorganic insulating films 16, 18, and 20 are penetrated in the bending section CL. Specifically, a penetration section Nx is formed in the lower face film 10, and a penetration section Na (a barrier layer slit) is formed in the barrier layer 3, and a penetration section Nb (a first inorganic insulating slit) is formed in the inorganic insulating film 16, and a penetration section Nc (a second inorganic insulating slit) is formed in the inorganic insulating film 18, and a penetration section Nd (a third inorganic insulating slit) is formed in the inorganic insulating film 20, and in a planar view, the penetration sections Nx, Nb, Nc, and Nd are aligned, and the penetration section Na aligned to the bending section CL is positioned on the inside of the penetration sections Nx, Nb, Nc, and Nd. The reinforcing film EZ is provided to fill a space formed by the penetration section Na (the barrier layer slit) and the penetration sections Nb, Nc, and Nd (the first to third inorganic insulating slits). Note that the penetration section Nx may not be formed in the lower face film 10.

As illustrated in FIGS. 4 and 5, the terminal wiring line TW includes first wiring lines WS1 and second wiring lines WS2 positioned on both sides of the bending section CL, and third wiring lines WS3 that pass through the bending section CL and electrically connect to both the first wiring lines WS1 and the second wiring lines WS2.

Specifically, the first wiring lines WS1 and the second wiring lines WS2 are formed on the same layer as that of the gate electrode GE (see FIG. 2) or the capacitance wiring line CE included in the TFT layer 4, and the third wiring lines WS3 are formed on the same layer as that of the source wiring lines SH (see FIG. 2) and the terminals TM included in the TFT layer 4.

The third wiring lines WS3 are led from one side of the bending section CL to the other side of the bending section CL over the reinforcing film EZ, and sandwiched between the reinforcing film EZ and the flattening film 21 in the bending section CL. The reinforcing film EZ and the flattening film 21 may be formed of the same organic material (e.g., polyimide).

As for each third wiring line WS3, one end thereof is connected to the corresponding first wiring line WS1 by a contact hole Hc1 formed in the inorganic insulating film 18 and a contact hole Hd1 formed in the inorganic insulating film 20. As for each third wiring line WS3, one end thereof is connected to the corresponding second wiring line WS2 by a contact hole Hc2 formed in the inorganic insulating film 18 and a contact hole Hd2 formed in the inorganic insulating film 20.

As illustrated in FIGS. 4 and 5, the reinforcing film EZ includes recessed portions EZa whose surfaces are recessed, and protruding portions EZb whose surfaces protrude, in the bending section CL. The third wiring lines WS3 are formed on the reinforcing film EZ, which causes recessed portions WS3a and protruding portions WS3b to be curved in a shape formed along the recessed portions EZa and the protruding portions EZb of the reinforcing film EZ. In other words, the third wiring lines WS3 are in a linear shape in a planar view (when viewed in a normal direction with respect to the display face of the display device 2), and recesses and protrusions are formed in the three-dimensional direction (film thickness direction).

The recessed portions EZa and the protruding portions EZb of the reinforcing film EZ are successively formed in the extending direction of the third wiring lines WS3. Thus, similarly, the recessed portions WS3a and the protruding portions WS3b of the third wiring lines WS3 are successively formed in the extending direction in the bending section CL.

In addition, as illustrated in FIGS. 4 and 6, the plurality of third wiring lines WS3 is arranged in parallel side by side. For example, pitches between the adjacent third wiring lines WS3 are approximately 18 μm.

Then, the recessed portions EZa and the protruding portions EZb of the reinforcing film EZ are successively alternately formed in a direction orthogonal to the extending direction of the third wiring lines WS3. Thus, each third wiring line WS3 formed on the reinforcing film EZ in the bending section CL is curved in the perpendicular direction of the display device along the recessed and protruded shape of the reinforcing film EZ in such a manner that the recessed portions WS3a and the protruding portions WS3b are alternately repeatedly formed in the extending direction.

In other words, a cycle of recesses and protrusions is shifted between the adjacent third wiring lines WS3.

For example, in the present embodiment, as illustrated in FIG. 6, the third wiring lines WS3 extend in such a manner as to pass bottom portions having the least film thickness on the recessed portions EZa of the reinforcing film EZ and pass head portions having the maximum film thickness on the protruding portions EZb of the reinforcing film EZ.

For example, pitches between the protruding portions WS3b (in other words, pitches between the protruding portions EZb) in the extending direction of the third wiring lines WS3 are approximately 36 µm. Pitches between the protruding portions WS3b (in other words, pitches between the protruding portions EZb) in a direction orthogonal to the extending direction of the third wiring lines WS3 may be identical to the pitches between the protruding portions WS3b (in other words, the pitches between the protruding portions EZb) in the extending direction of the third wiring lines WS3.

For example, the height of the protruding portions WS3b (a distance from the bottom portion of the recessed portion WS3a to the head portion of the protruding portion WS3b), in other words, the height of the protruding portion EZb (a distance from the bottom portion of the recessed portion EZa to the head portion of the protruding portion EZb) is approximately higher than or equal to 1 µm and lower than or equal to 2 µm.

The height of the protruding portions WS3b (in other words, the height of the protruding portion EZb) may be periodically changed at least in one of the extending direction of the third wiring lines WS3 and the direction orthogonal to the extending direction of the third wiring lines WS3. In addition, the pitches between the protruding portions WS3b (in other words, the pitches between the protruding portions EZb) may be periodically changed at least in one of the extending direction of the third wiring lines WS3 and the direction orthogonal to the extending direction of the third wiring lines WS3.

In addition, the third wiring lines WS3 and the resin layer 12 may be in contact with each other on the bottom portion of the recessed portions EZa of the reinforcing film EZ by removing almost all of the recessed portions EZa of the reinforcing film EZ. Alternatively, the bottom portion of the recessed portions EZa of the reinforcing film EZ may have a film thickness to some extent, thereby interposing the reinforcing film EZ between the third wiring lines WS3 and the resin layer 12 on the bottom portion of the recessed portions EZa.

Figure 8:
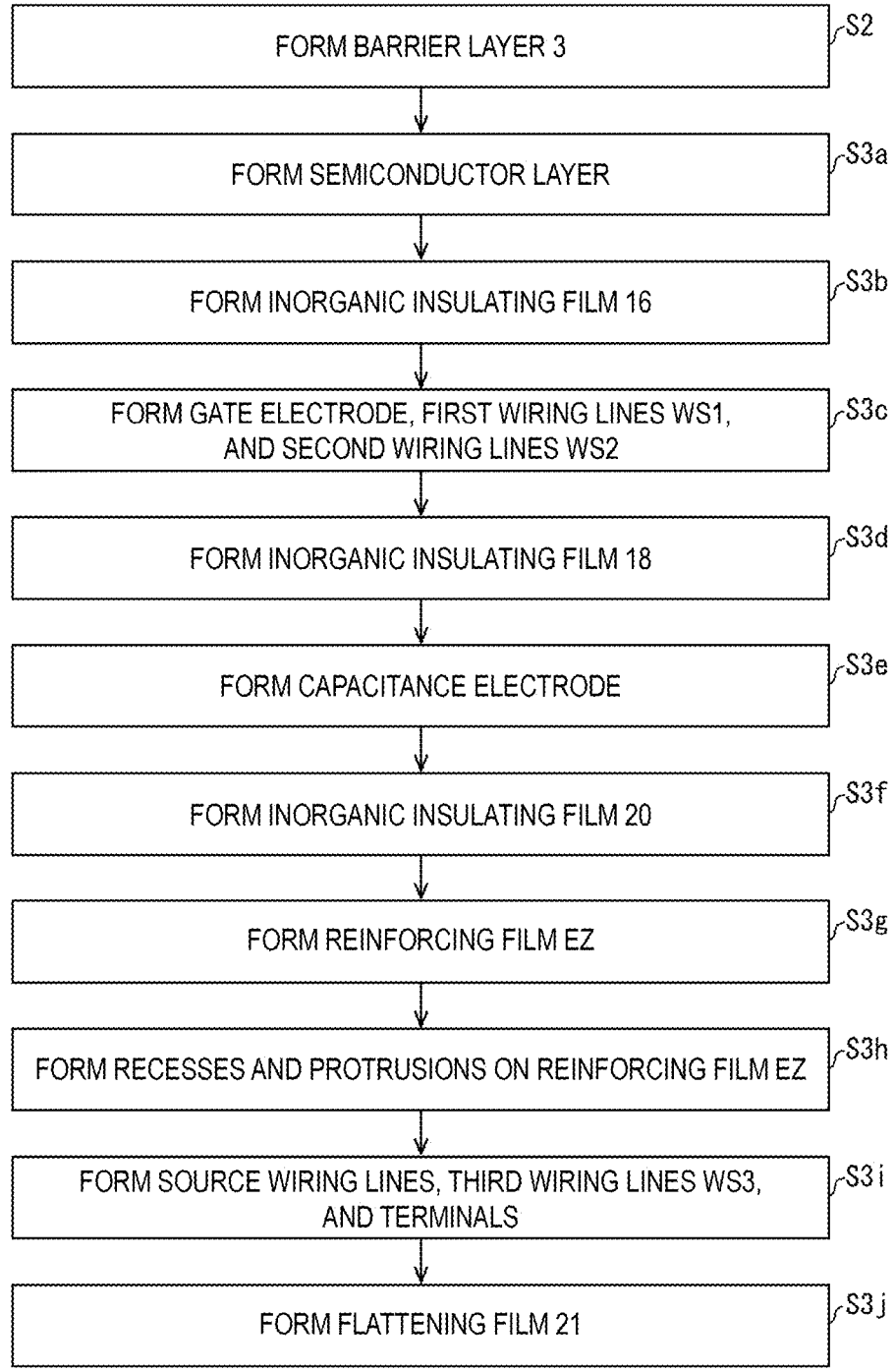
FIG. 8 is a flowchart illustrating an example of the formation of a TFT layer of the first embodiment.

FIG. 8 is a flowchart illustrating an example of the formation of a TFT layer of the first embodiment. Subsequent to Step S1 in FIG. 1, the barrier layer 3 is formed at Step S2. At the next Step S3a, the semiconductor film 15 (see FIG. 2) is formed. At the next Step S3b, the inorganic insulating film 16 is formed. At the next Step S3c, the gate electrode, the first wiring lines WS1, and the second wiring lines WS2 are formed. At the next Step S3d, the inorganic insulating film 18 is formed. At the next Step S3e, the capacitance electrode CE (see FIG. 2) is formed.

At the next Step S3f, the inorganic insulating film 20 is formed. At the Step S3f, the inorganic insulating film 20 is formed, and the inorganic insulating film 20, the inorganic insulating film 18, the inorganic insulating film 16, and the barrier layer 3 in the bending section CL are collectively removed by etching. This forms the penetration section Na in the barrier layer 3, the penetration section Nb in the inorganic insulating film 16, the penetration section Nc in the inorganic insulating film 18, the penetration section Nd in the inorganic insulating film 20, in the bending section CL. Consequently, steps between the side face of the penetration section Na, the side face of the penetration section Nb, the side face of the penetration section Nc, and the side face of the penetration section Nd are not formed, and all the penetration sections lie on the same plane.

At the next Step S3g, the reinforcing film EZ is formed in an area surrounded by the penetration sections Na, Nb, Nc, and Nd in the bending section CL. At the next Step S3h, the recessed and protruded shape in which the recessed portions EZa and the protruding portions EZb are alternately repeated is formed by partially removing the surface of the reinforcing film EZ.

At the next Step S3i, the source wiring line SH (see FIG. 2), the third wiring lines WS3, and the terminals TM are formed. Consequently, the third wiring lines WS3 are curved along the recesses and protrusions of the reinforcing film EZ in the bending section CL in such a manner that the recessed portions WS3a and the protruding portions WS3b are alternately repeatedly formed in the extending direction. At the next Step S3j, the flattening film 21 is formed (see FIG. 1 for subsequent processes onward).

As illustrated in FIGS. 4 and 5, in the first embodiment, the third wiring lines WS3 included in the terminal wiring line TW pass through the bending section CL, electrically connect with the first wiring lines and second wiring lines, and include the recessed portions WS3a and the protruding portions WS3b in such a manner as to be curved in the recessed and protruded manner in the bending section CL.

Consequently, even when the bending section CL is bent by 180 degrees (see FIG. 7), stress applied to the third wiring lines WS3 is dispersed. This can reduce a possibility that the third wiring lines WS3 might be broken.

In addition, it is not necessary to curve the third wiring lines WS3 in a planar direction (direction in parallel to the display face of the display device 2) in the bending section CL or partially increase the widths of the third wiring lines WS3, in order to prevent breaks of the third wiring lines WS3. Thus, the widths of the third wiring lines WS3 can be reduced, and the pitches between the third wiring lines WS3 can be decreased. As a result, the frame narrowing of the display device 2 can be performed.

Thus, with the aforementioned configuration, the frame narrowing of the display device 2 can be performed, and further a possibility that the third wiring lines WS3 in the bending section CL might be broken can be reduced.

In addition, as illustrated in FIG. 5, the barrier layer 3 and the inorganic insulating films 16, 18, and 20 (which are closely-packed and solid) formed using CVD are penetrated in the bending section CL, so that stress in bending the bending section CL is reduced, and the breaks of the third wiring lines WS3 are unlikely to occur.

In addition, the third wiring lines WS3 in the bending section CL are sandwiched between organic materials formed of a coating that is high in flexibility compared to the inorganic materials formed using CVD, and thus the breaks of the third wiring lines WS3 are unlikely to occur.

Herein, as illustrated in FIG. 4, in some cases, the extending direction of a curved portion in a case where the bending section CL is bent by 180 degrees corresponds to the direction orthogonal to the extending direction of the third wiring lines WS3. However, for example, in some cases, a bending position is shifted in the range of approximately 0.1 mm.

Thus, as illustrated in a dot-dashed line CLa in FIG. 4, there is a case where the extending direction of the curved portion is shifted in some degrees from the direction orthogonal to the extending direction of the third wiring lines WS3, and the bending section CL is obliquely bent.

However, in the first embodiment, as illustrated in FIGS. 4 and 6, the recessed portions EZa and the protruding portions EZb of the reinforcing film EZ are successively alternately formed in the direction orthogonal to the extending direction of the third wiring lines WS3.

Thus, even when the bending section CL is obliquely bent, stress applied to the curved portion due to bending is dispersed because both the recessed portions EZa and the protruding portions EZb of the reinforcing film EZ are included in the extending direction. Consequently, even when the bending section CL is obliquely bent, a break of each third wiring line WS3 is unlikely to occur.

Second Embodiment

Figure 9:
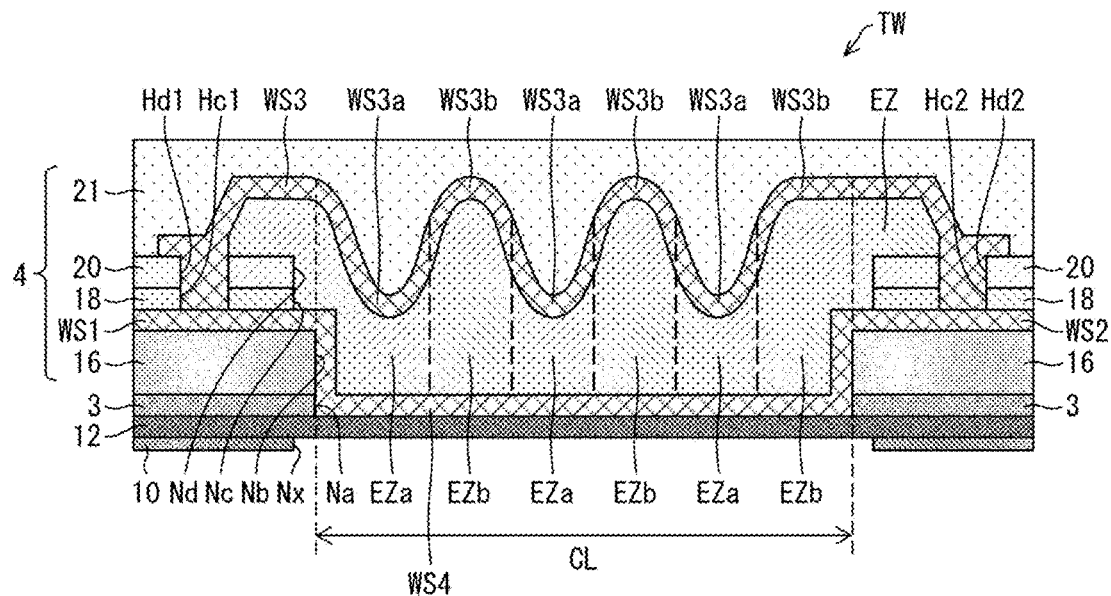
FIG. 9 is a cross-sectional view illustrating the peripheral edge of the display device of a second embodiment.
Figure 10:
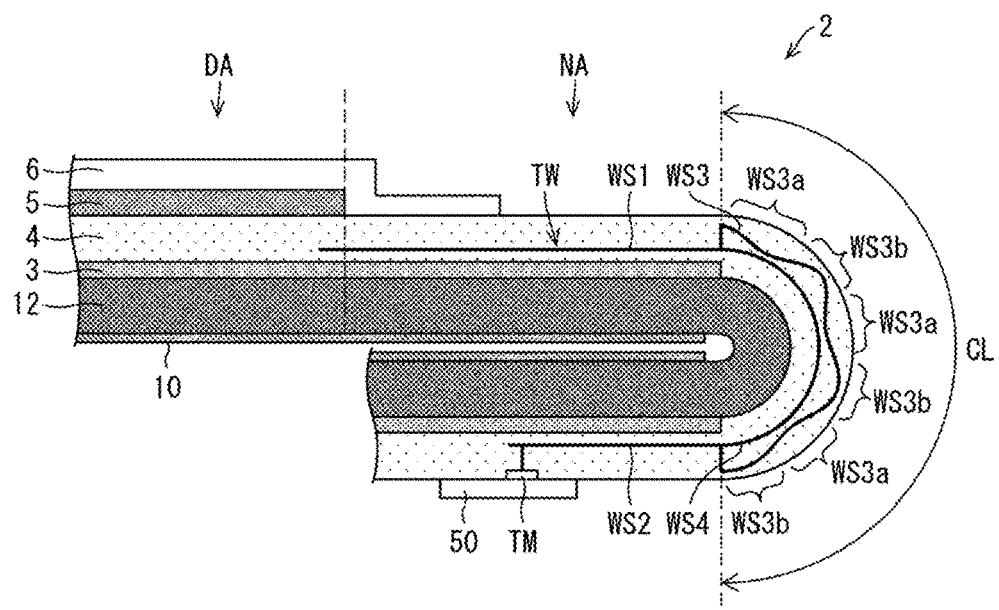
FIG. 10 is a cross-sectional view illustrating an example of the bending of a non-active area of the display device of the second embodiment.

Configuration in which other wiring lines except for the third wiring lines WS3 pass through the bending section CL may be applied. FIG. 9 is a cross-sectional view illustrating a peripheral edge of the display device of a second embodiment. FIG. 10 is a cross-sectional view illustrating an example of the bending of the non-active area of the display device of the second embodiment. Note that the plane configuration of the peripheral edge of the display device of the second embodiment is identical to the configuration illustrated in FIG. 4.

In the second embodiment, the terminal wiring line TW further includes fourth wiring lines WS4, in addition to the configuration of the first embodiment. The fourth wiring lines WS4 are superimposed on the third wiring lines WS3 via the reinforcing film EZ and electrically connected to both the first wiring lines WS1 and second wiring lines WS2. The fourth wiring lines WS4 are in contact with the resin layer 12 in the bending section CL and extend through the penetration sections Na and Nb.

The first wiring lines WS1, the second wiring lines WS2, and the fourth wiring lines WS4 are formed in the same layer as that of the gate electrode GE (see FIG. 2) included in the TFT layer 4, and the third wiring lines WS3 are formed in the same layer as that of the source wiring lines SH (see FIG. 2) and the terminals TM included in the TFT layer 4.

The third wiring lines WS3 are led from one side of the bending section CL to the other side of the bending section CL through the reinforcing film EZ, and sandwiched between the reinforcing film EZ and the flattening film 21 in the bending section CL. The fourth wiring lines WS4 are led from one side of the bending section CL to the other side of the bending section CL through the penetration sections Na and Nb and sandwiched between the resin layer 12 and the reinforcing film EZ in the bending section CL. The reinforcing film EZ and the flattening film 21 may be formed of the same organic material (e.g., polyimide).

The one end of each third wiring line WS3 is connected to one end of the corresponding first wiring line WS1 and one end of the corresponding fourth wiring line WS4 by a contact hole Hc1 formed in the inorganic insulating film 18 and a contact hole Hd1 formed in the inorganic insulating film 20 and communicating with the contact hole Hc1, and the other end of each third wiring line WS3 is connected to the other ends of the corresponding second wiring line WS2 and the corresponding fourth wiring line WS4 by a contact hole Hc2 formed in the inorganic insulating film 18 and a contact hole Hd2 formed in the inorganic insulating film 20 and communicating with the contact hole Hd2.

Figure 11:
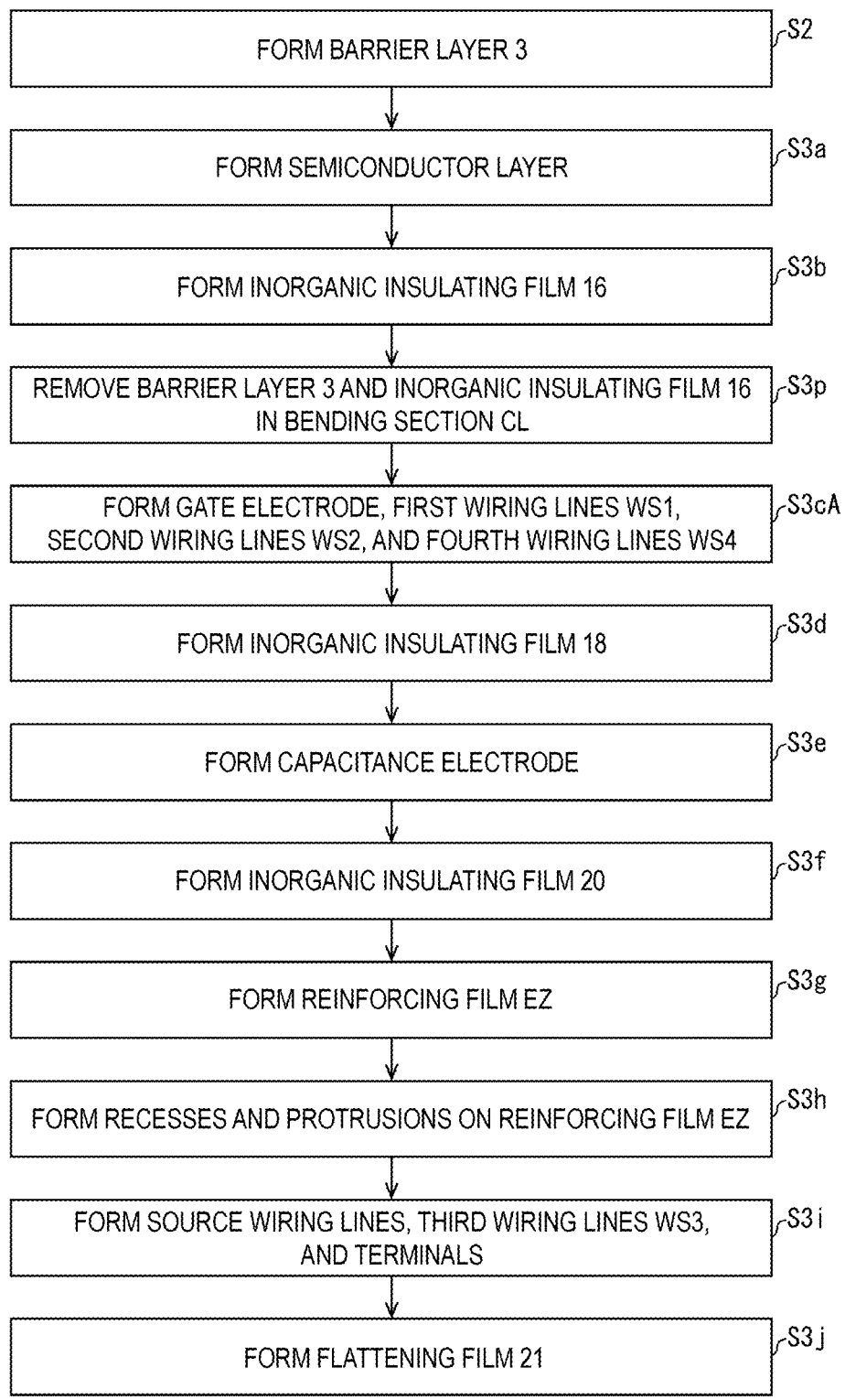
FIG. 11 is a flowchart illustrating an example of the formation of a TFT layer of the second embodiment.

FIG. 11 is a flowchart illustrating an example of the formation of a TFT layer of the second embodiment. Subsequent to Step S1 in FIG. 1, the barrier layer 3 is formed at Step S2. At the next Step S3a, the semiconductor film 15 (see FIG. 2) is formed. At the next Step S3b, the inorganic insulating film 16 is formed.

At Step S3p, the inorganic insulating film 16 and the barrier layer 3 in the bending section CL are collectively removed by etching. This forms the penetration section Na in the barrier layer 3 and forms the penetration section Nb in the inorganic insulating film 16 in the bending section CL. Consequently, steps between the side face of the penetration section Na and the side face of the penetration section Nb are not formed, and both the penetration sections lie on the same plane.

At the next Step S3cA, the gate electrode, the first wiring lines WS1, the second wiring lines WS2, and the fourth wiring lines WS4 are formed. Note that the inorganic insulating film 16 and the barrier layer 3 are removed in the bending section CL, and thus the fourth wiring lines WS4 come in contact with the resin layer 12.

At the next Step S3d, the inorganic insulating film 18 is formed. At the next Step S3e, the capacitance electrode CE (see FIG. 2) is formed.

At the next Step S3f, the inorganic insulating film 20 is formed. At the Step S3f, the inorganic insulating film 20 is formed, and the inorganic insulating films 20 and the inorganic insulating film 18 in the bending section CL are collectively removed by etching. This forms the penetration section Nc in the inorganic insulating film 18 and forms the penetration section Nd in the inorganic insulating film 20 in the bending section CL. Consequently, steps between the side face of the penetration section Nc and the side face of the penetration section Nd are not formed, and both the penetration sections lie on the same plane.

Note that in the present embodiment, a process in which the penetration section Na and the penetration section Nb are formed is different from a process in which the penetration section Nc and the penetration section Nd are formed, so that steps may be formed between the respective side faces of the penetration section Na and the penetration section Nb and the respective side faces of the penetration section Nc and the penetration section Nd. In the example illustrated in FIG. 9, the widths of the penetration section Na and the penetration section Nb are wider than the widths of the penetration section Nc and the penetration section Nd, and thus steps are formed between the respective side faces of the penetration section Na and the penetration section Nb and the respective side faces of the penetration section Nc and the penetration section Nd.

At the next Step S3g, the reinforcing film EZ is formed. At the next Step S3h, the recessed and protruded shape in which the recessed portions EZa and the protruding portions EZb are alternately repeated is formed by partially removing the surface of the reinforcing film EZ.

At the next Step S3h, the source wiring lines SH (see FIG. 2), the third wiring lines WS3, and the terminals TM are formed. Consequently, the third wiring lines WS3 are curved along the recesses and protrusions of the reinforcing film EZ in the bending section CL in such a manner that the recessed portions WS3a and the protruding portions WS3b are alternately repeatedly formed in the extending direction. At the next Step S3j, the flattening film 21 is formed (see FIG. 1 for subsequent processes onward).

As illustrated in FIGS. 9 and 10, in the second embodiment, the terminal wiring line TW includes the third wiring lines WS3 and the fourth wiring lines WS4 passing through the bending section CL, so that even when the third wiring lines WS3 might be broken, electrical channel from the first wiring lines WS1 to the second wiring lines WS2 can be maintained with the fourth wiring lines WS4, and a possibility that the terminal wiring line TW might be broken in the bending section CL is reduced.

Third Embodiment

The recesses and protrusions of the reinforcing film EZ are formed only in the extending direction of the third wiring lines WS3 and may not be formed in the direction orthogonal to the extending direction of the third wiring lines WS3.

Figure 12:
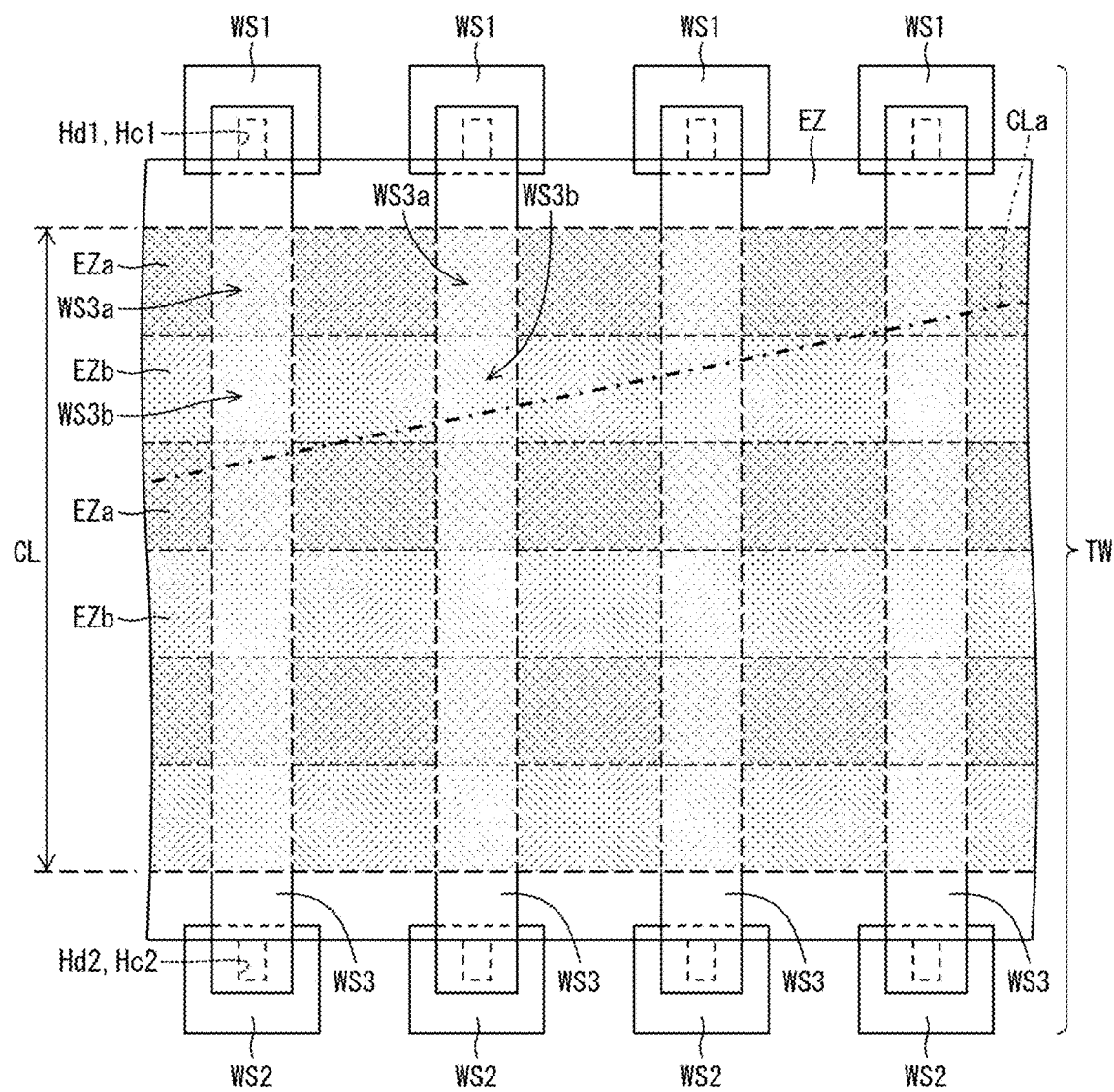
FIG. 12 is a plan view illustrating a peripheral edge of the display device of a third embodiment.

FIG. 12 is a plan view illustrating a peripheral edge of the display device of a third embodiment. As illustrated in FIG. 12, in the third embodiment, the recessed portions EZa and the protruding portions EZb of the reinforcing film EZ are alternately successively arranged side by side in the extending direction of the third wiring lines WS3. In contrast, the recessed portions EZa and the protruding portions EZb of the reinforcing film EZ each extend in the direction orthogonal to the extending direction of the third wiring lines WS3.

Consequently, the recessed portions WS3a and the protruding portions WS3b of the third wiring lines WS3 are alternately successively arranged in the extending direction of the third wiring lines WS3. Then, cycles of recesses and protrusions are identical between the adjacent third wiring lines WS3.

Thus, as illustrated in a dot-dashed line CLa in FIG. 12, there is a case where the extending direction of the curved portion formed by bending the bending section CL is shifted in some degrees from the direction orthogonal to the extending direction of the third wiring lines WS3, and even when the bending section CL is obliquely bent, the curved portion includes both the recessed portions EZa and the protruding portions EZb of the reinforcing film EZ in the extending direction. Thus, stress due to bending is dispersed.

Thus, even when the bending section CL is obliquely bent, a break of each third wiring line WS3 is unlikely to occur, compared with the case where the reinforcing film is flat.

Supplement

An electro-optical element (an electro-optical element whose luminance and transmittance are controlled by an electric current) that is provided in the display device according to the present embodiment is not particularly limited. Examples of the display device according to the present embodiment include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

First Aspect

A display device includes a resin layer, a TFT layer configured to be provided on an upper layer of the resin layer. a plurality of light-emitting element layers configured to form a display area and configured to be provided on an upper layer of the TFT layer, a frame area configured to be provided in a periphery of the display area, a terminal section configured to be provided on an end section of the frame area, a bending section configured to be provided between the display area and the terminal section, and a terminal wiring line configured to be provided on the bending section and electrically connect to the terminal section, wherein the terminal wiring line includes a first wiring line and a second wiring line positioned on both sides of the bending section, and at least one third wiring line passing through the bending section and being electrically connected with each of the first wiring line and the second wiring line, and the third wiring line is curved so as to have recesses and protrusions in the bending section in a perpendicular direction of the display device.

Second Aspect

The display device according to the first aspect is such that a plurality of inorganic insulating films is included in the TFT layer, and the plurality of inorganic insulating films is penetrated in the bending section.

Third Aspect

The display device according to the second aspect includes a barrier layer between the resin layer and the TFT layer, and a barrier layer slit formed by penetrating the barrier layer is provided in the bending section.

Fourth Aspect

The display device according to the third aspect is such that the plurality of inorganic insulating films includes a first inorganic insulating film configured to be provided in a layer between the first wiring line and the second wiring line, and the barrier layer, and a second inorganic insulating film configured to be provided on an upper layer of the first wiring line and the second wiring line, and a first inorganic insulating film slit formed by penetrating the first inorganic insulating film and a second inorganic insulating film slit formed by penetrating the second inorganic insulating film are provided in the bending section, and the barrier layer slit, the first inorganic insulating film slit, and the second inorganic insulating film slit are overlapped.

Fifth Aspect

The display device according to the fourth aspect is such that a reinforcing film is formed filling the barrier layer slit, the first inorganic insulating film slit, and the second inorganic insulating film slit, and recesses and protrusions are formed on the reinforcing film, and the recesses and protrusions of the third wiring line are formed in a shape along the recesses and protrusions of the reinforcing film.

Sixth Aspect

The display device according to the fifth aspect is such that the recesses and protrusions of the reinforcing film are successively formed in an extending direction of the third wiring line.

Seventh Aspect

The display device according to the fifth or sixth aspect is such that the recesses and protrusions of the reinforcing film are successively formed in a direction orthogonal to the extending direction of the third wiring line.

Eight Aspect

The display device according to the seventh aspect is such that the at least one third wiring line includes a plurality of third wiring lines, and the plurality of third wiring lines is arranged in parallel side by side, and each third wiring line extends through a bottom portion of a recessed portion of the reinforcing film or a head portion of a protruding portion of the reinforcing film.

Ninth Aspect

The display device according to the fifth aspect is such that a recessed portion and a protruding portion of the reinforcing film each extend in a direction orthogonal to an extending direction of the third wiring line.

Tenth Aspect

The display device according to the fourth to ninth aspects is such that a side face of the barrier layer slit, a side face of the first inorganic insulating film slit, and a side face of the second inorganic insulating film slit are flush with each other.

Eleventh Aspect

The display device according to the fifth to ninth aspects is such that the terminal wiring line is formed on a same layer as that of the first wiring line and the second wiring line and includes a fourth wiring line configured to electrically connect with each of the first wiring line and the second wiring line.

Twelfth Aspect

The display device according to the eleventh aspect is such that a side face of the barrier layer slit and a side face of the first inorganic insulating film slit are flush with each other, and a step is formed between the side face of the barrier layer slit and the side face of the first inorganic insulating film slit, and a side face of the second inorganic insulating film slit, and a width of the barrier layer slit and the first inorganic insulating film slit is wider than a width of the second inorganic insulating film slit.

Thirteenth Aspect

The display device according to the twelfth aspect is such that the reinforcing film is provided on an upper layer of the fourth wiring line, and the fourth wiring line extends through the barrier layer slit and the first inorganic insulating film slit while being in contact with the resin layer in the bending section.

Fourteenth Aspect

The display device according to the first to thirteenth aspects is such that the third wiring line is formed on a same layer as that of the terminal section.

Fifteenth Aspect

The display device according to the first to fourth aspects is such that the first wiring line and the second wiring line are formed on a same layer as that of a gate electrode or a capacitance wiring line included in the TFT layer.

Sixteenth Aspect

The display device according to the fifth to ninth aspects is such that the third wiring line is sandwiched between the reinforcing film and a flattening film that serves as an underlayer of the light-emitting element layer in the bending section.

Seventeenth Aspect

A manufacturing method of a display device configured to include a resin layer, a TFT layer configured to be provided on an upper layer of the resin layer, a plurality of light-emitting element layers configured to form a display area and configured to be provided on an upper layer of the TFT layer, a frame area configured to be provided in a periphery of the display area, a terminal section configured to be provided on an end section of the frame area, a bending section configured to be provided between the display area and the terminal section, and a terminal wiring line configured to be provided on the bending section and electrically connect to the terminal section, the manufacturing method includes forming a first wiring line and a second wiring line that are positioned on both sides of the bending section, and forming a third wiring line that is electrically connected with each of the first wiring line and the second wiring line and curved in a recessed and protruding manner in the bending section in a perpendicular direction of the display device.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
3 Barrier layer
4 TFT layer
5 Light emitting-element layer
6 Sealing layer
12 Resin layer
16, 18, 20 Inorganic insulating film
21 Flattening film
23 Bank (Anode edge cover)
23z Organic insulating film
24 EL layer
70 Display device manufacturing apparatus
EZ Reinforcing film
TM Terminal
TW Terminal wiring line
WS1 to WS4 First wiring line to Fourth wiring line

The invention claimed is:

1. A display device comprising:
a resin layer;
a TFT layer configured to be provided on an upper layer of the resin layer;
a plurality of light-emitting element layers configured to form a display area and configured to be provided on an upper layer of the TFT layer;
a frame area configured to be provided in a periphery of the display area;
a terminal section configured to be provided on an end section of the frame area;
a bending section configured to be provided between the display area and the terminal section;
a terminal wiring line configured to be provided on the bending section and electrically connect to the terminal section, wherein
the terminal wiring line includes a first wiring line and a second wiring line positioned on both sides of the bending section, and at least one third wiring line passing through the bending section and being electrically connected with each of the first wiring line and the second wiring line,
the third wiring line is curved so as to have recesses and protrusions in the bending section in a perpendicular direction of the display device,
a plurality of inorganic insulating films is included in the TFT layer,
the plurality of inorganic insulating films is penetrated in the bending section,
a barrier layer is provided between the resin layer and the TFT layer,
a barrier layer slit formed by penetrating the barrier layer is provided in the bending section,
the plurality of inorganic insulating films includes
a first inorganic insulating film configured to be provided in a layer between the first wiring line and the second wiring line, and the barrier layer, and
a second inorganic insulating film configured to be provided on an upper layer of the first wiring line and the second wiring line, a first inorganic insulating film slit formed by penetrating the first inorganic insulating film and a second inorganic insulating film slit formed by penetrating the second inorganic insulating film are provided in the bending section, the barrier layer slit, the first inorganic insulating film slit, and the second inorganic insulating film slit are overlapped, a reinforcing film is formed filling the barrier layer slit, the first inorganic insulating film slit, and the second inorganic insulating film slit, recesses and protrusions are formed on the reinforcing film, the recesses and protrusions of the third wiring line are formed in a shape along the recesses and protrusions of the reinforcing film, the terminal wiring line is formed on a same layer as that of the first wiring line and the second wiring line and includes a fourth wiring line configured to electrically connect with each of the first wiring line and the second wiring line, a side face of the barrier layer slit and a side face of the first inorganic insulating film slit are flush with each other, a step is formed between the side face of the barrier layer slit and the side face of the first inorganic insulating film slit, and a side face of the second inorganic insulating film slit, and a width of the barrier layer slit and the first inorganic insulating film slit is wider than a width of the second inorganic insulating film slit.

2. The display device according to claim 1,
wherein the recesses and protrusions of the reinforcing film are successively formed in an extending direction of the third wiring line.

3. The display device according to claim 1,
wherein the recesses and protrusions of the reinforcing film are successively formed in a direction orthogonal to an extending direction of the third wiring line.

4. The display device according to claim 3,
wherein the at least one third wiring line includes a plurality of third wiring lines,
the plurality of third wiring lines is arranged in parallel side by side, and
each third wiring line extends through a bottom portion of a recessed portion of the reinforcing film or a head portion of a protruding portion of the reinforcing film.

5. The display device according to claim 1,
wherein a recessed portion and a protruding portion of the reinforcing film each extend in a direction orthogonal to an extending direction of the third wiring line.

6. The display device according to claim 1,
wherein the reinforcing film is provided on an upper layer of the fourth wiring line, and
the fourth wiring line extends through the barrier layer slit and the first inorganic insulating film slit while being in contact with the resin layer in the bending section.

7. The display device according to claim 1,
wherein the third wiring line is formed on a same layer as that of the terminal section.

8. The display device according to claim 1,
wherein the first wiring line and the second wiring line are formed on a same layer as that of a gate electrode or a capacitance wiring line included in the TFT layer.

9. The display device according to claim 1,
wherein the third wiring line is sandwiched between the reinforcing film and a flattening film that serves as an underlayer of the light-emitting element layer in the bending section.

\* \* \* \* \*